(12) United States Patent
Choi et al.

(10) Patent No.: US 10,332,940 B2
(45) Date of Patent: Jun. 25, 2019

(54) ORGANIC LIGHT EMITTING DIODE DISPLAY DEVICE

(71) Applicant: LG DISPLAY CO., LTD., Seoul (KR)

(72) Inventors: Howon Choi, Paju-si (KR); Suhyeon Kim, Paju-si (KR); Hyesook Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/291,924

(22) Filed: Oct. 12, 2016

(65) Prior Publication Data

US 2017/0179202 A1    Jun. 22, 2017

(30) Foreign Application Priority Data

Dec. 17, 2015  (KR) .................. 10-2015-0181213

(51) Int. Cl.
| | |
|---|---|
| H01L 27/32 | (2006.01) |
| H01L 51/00 | (2006.01) |
| H01L 51/50 | (2006.01) |
| H01L 51/52 | (2006.01) |
| H01L 51/56 | (2006.01) |

(52) U.S. Cl.
CPC ........ *H01L 27/322* (2013.01); *H01L 27/3213* (2013.01); *H01L 51/0031* (2013.01); *H01L 51/5012* (2013.01); *H01L 51/5218* (2013.01); *H01L 51/5234* (2013.01); *H01L 51/5284* (2013.01); *H01L 51/56* (2013.01); *H01L 2251/5315* (2013.01); *H01L 2251/558* (2013.01)

(58) Field of Classification Search
CPC ............... H01L 27/322; H01L 51/5234; H01L 51/0031; H01L 2251/558; H01L 2251/5315; H01L 51/5012; H01L 51/5284; H01L 51/56; H01L 51/5218
See application file for complete search history.

(56) References Cited

U.S. PATENT DOCUMENTS

| | | | |
|---|---|---|---|
| 2005/0089772 A1* | 4/2005 | Kawaguchi | ............ G02B 5/201 |
| | | | 430/7 |
| 2011/0101857 A1 | 5/2011 | Kanatani et al. | |
| 2012/0205686 A1* | 8/2012 | Seo | ...................... H01L 27/3209 |
| | | | 257/89 |
| 2014/0184972 A1 | 7/2014 | Park et al. | |
| 2015/0349029 A1 | 12/2015 | Choi et al. | |

(Continued)

FOREIGN PATENT DOCUMENTS

| | | |
|---|---|---|
| JP | 2013-213873 A | 10/2013 |
| JP | 2014-048646 A | 3/2014 |

(Continued)

*Primary Examiner* — Robert T Huber
*Assistant Examiner* — Gardner W. S. Swan
(74) *Attorney, Agent, or Firm* — Dentons US LLP

(57) ABSTRACT

The present disclosure provides an organic light emitting diode display device including: first to third color filter layers disposed corresponding to red, green, and blue sub-pixels, respectively; and a fourth color filter layer alternately arranged including a color layer having the same color as any one of the first to third color filter layers in a white sub-pixel in each of a plurality of pixels, and having a smaller height than the first to third color filter layers. Additional color filter layers may also be included. The display device of the present disclosure has lower reflectance and enhanced black color expression.

7 Claims, 11 Drawing Sheets

(56) References Cited

U.S. PATENT DOCUMENTS

2015/0349030 A1   12/2015  Ono et al.
2016/0033816 A1*  2/2016  Yoon ................ G02F 1/133512
                                                  349/108
2017/0038871 A1*  2/2017  Zhou .................. G02F 1/13338

FOREIGN PATENT DOCUMENTS

| JP | 2014-142610 A | 8/2014 |
|----|---------------|--------|
| KR | 10-2012-0134222 A | 12/2012 |
| KR | 10-2015-0060200 A | 6/2015 |
| KR | 10-2015-0125202 A | 11/2015 |
| KR | 2015-0136733 A | 12/2015 |
| KR | 101736929 B1 * | 5/2017 |

* cited by examiner

FIG.10
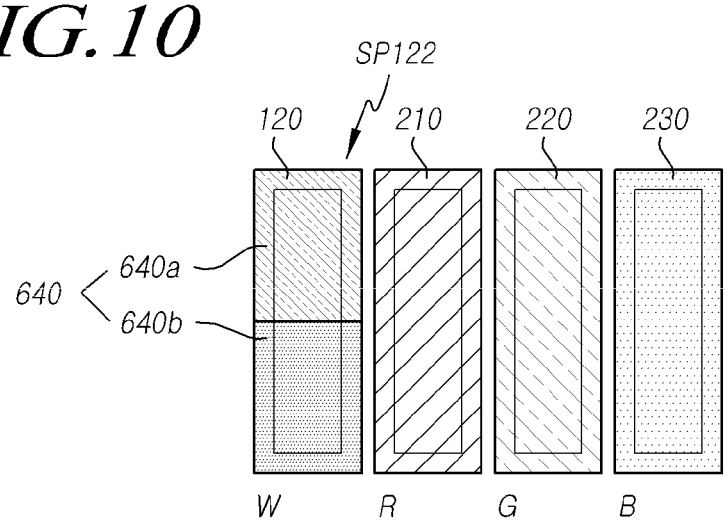
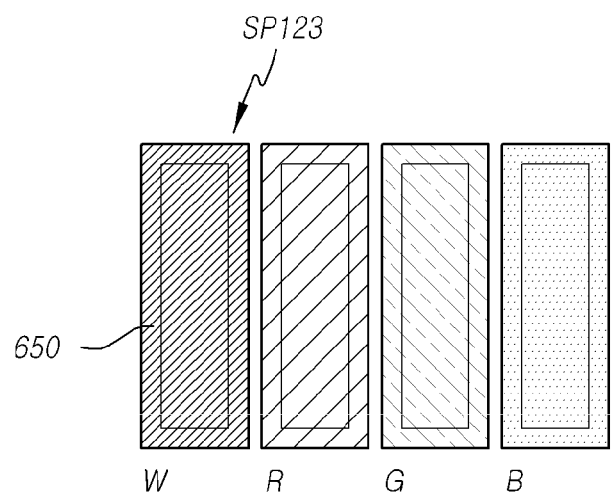
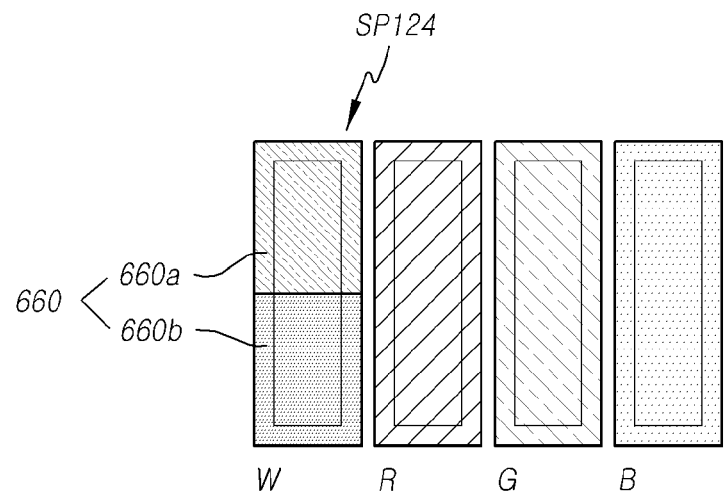

FIG. 11
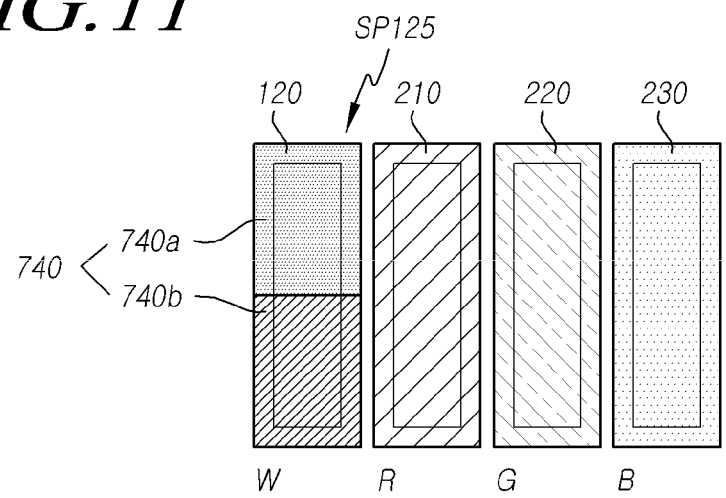
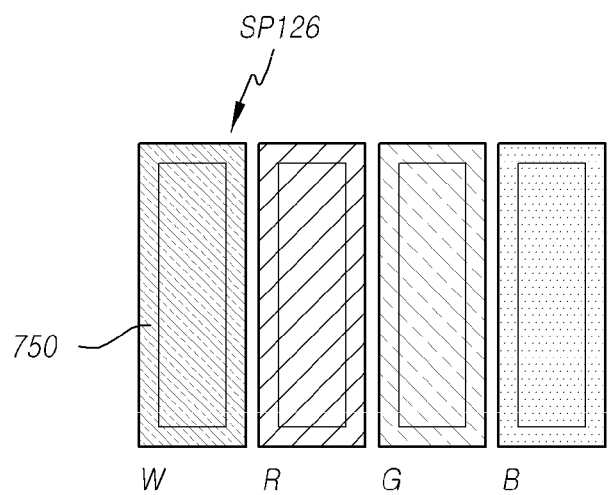
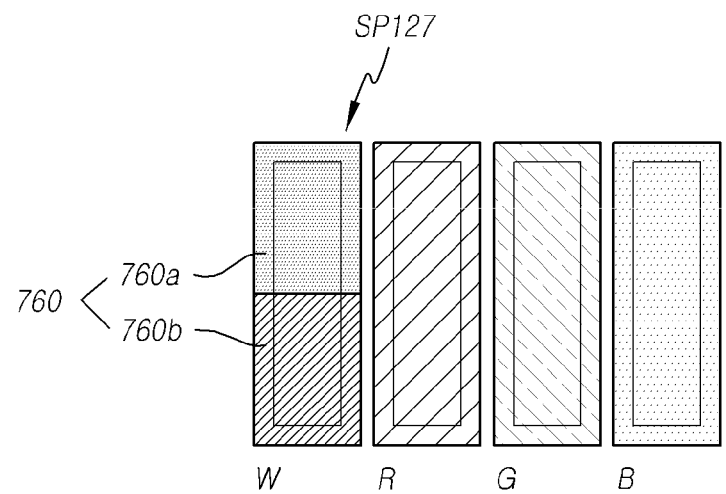

ORGANIC LIGHT EMITTING DIODE DISPLAY DEVICE

CROSS-REFERENCE TO RELATED APPLICATIONS

This application claims priority from Korean Patent Application No. 2015-0181213 filed on Dec. 17, 2015, which is hereby incorporated by reference for all purposes as if fully set forth herein.

BACKGROUND

The exemplary embodiments of the present disclosure relate to an organic light emitting diode display device, and more particularly, to an organic light emitting diode display device capable of reducing the reflectance thereof and producing a clear black color.

DESCRIPTION OF THE RELATED ART

With the progress of today's information-oriented society, there is an ever increasing demand for for devices capable of displaying an image. Recently, various kinds of flat panel display devices such as a liquid crystal display (LCD) device, a plasma display panel (PDP) device, an organic light emitting diode (OLED) display device, etc., have been used as such image-displaying devices.

Of the above-described display devices, an OLED display device can be manufactured in a lightweight and thin form because it uses a self-illuminating light emitting element and thus, does not need a backlight, such as used for a liquid crystal display (LCD) device having a non-emitting element. Further, the OLED display device has a superior viewing angle and contrast ratio, and consumes less power compared with the LCD device. In addition, the OLED display device can be driven at a low DC voltage, has a high response speed and includes solid internal components. Therefore, the OLED display device has a high resistance to external shocks, can be used at a wide temperature range, and particularly, has low manufacturing costs.

Such an OLED display device may be a top-emission type or a bottom-emission type device depending on the structure of the organic light emitting element, and may including a first electrode, a second electrode, and an organic light emitting layer. In a bottom-emission type OLED display device, visible light generated from the organic light emitting layer is displayed on a bottom side of a substrate on which a TFT is formed, or located. On the other hand, in a top-emission type OLED display device, visible light generated from the organic light emitting layer is displayed on a top side of the substrate on which the TFT is formed, or located.

OLED display devices often include a polarizing plate, such as a circular polarizing plate or a linear polarizing plate, reduces external light reflection to improve visibility and the quality of the output black color. However, including a polarizing plate in the OLED display device is costly and reduces the brightness of the OLED display device.

In view of the above, the polarizing plate should ideally be removed from the organic light emitting display panel. However, removing the polarizing plate increases the reflectance of the organic light emitting display panel and deteriorates the black color expression. Particularly, in an OLED display device including a white (W) sub-pixel, the white (W) sub-pixel without a color filter layer is far higher in reflectance than red (R), green (G), and blue (B) sub-pixels each including a color filter layer, which causes an increase in reflectance of the entire panel. Further, the color filter layers disposed in the red (R), green (G), and blue (B) sub-pixels cause deterioration in the visual expression of black color in the OLED display device.

Accordingly, there is an increasing need for an OLED display device capable of solving this problem.

SUMMARY

In an exemplary embodiment, the organic light emitting diode display may comprises a first electrode, an organic light emitting layer, and a second electrode, where the first electrode is a reflective electrode and the second electrode a transparent conductive material. Alternatively, the first electrode may be a transparent conductive material and the second electrode may a reflective electrode.

An exemplary aspect of the present disclosure provides an organic light emitting diode display device which does not use a circular polarizing plate or a linear polarizing plate, but despite the absence of a polarizing plate, can improve light efficiency, reduce reflectance, and improve visual expression of black color.

An exemplary aspect of the present disclosure provides an organic light emitting diode display device including a substrate having a plurality of pixels each including red, white, green, and blue sub-pixels. Such a display device may also include first to third color filter layers disposed corresponding to the red, green, and blue sub-pixels, and a fourth color filter layer alternately including a color layer having the same color as any one of the first to third color filter layers in the white sub-pixel in each of the plurality of pixels, and where the fourth color filter has a smaller height than the first to third color filter layers.

In another exemplary embodiment, at least two of the four color filter layers in the respective pixels may be formed to have different thicknesses.

In another exemplary embodiment, the fourth color filter layer may be formed by laminating at least two different color layers.

In another exemplary embodiment, the thickness of the first to third color filter layers may be 2 µm to 3 µm, and the thickness of the fourth color filter layer may be 0.1 µm to 1 µm.

In another exemplary embodiment, the color of the color filter layers may alternate in a sequence that comprises the colors blue, green, and red. The color filter layers may alternate in repeating sequence.

In another exemplary embodiment, the blue color filter layer may be configured to transmit light having a wavelength of 450 to 470 nm and absorb other wavelengths of light; the green color filter layer may be configured to transmit light having a wavelength of 520 to 560 nm and absorb other wavelengths of light; and the red color filter layer may be configured to transmit light having a wavelength of 620 to 640 nm and absorb other wavelengths of light.

In another exemplary embodiment, at least two of the four color filter layers in the respective pixels may be formed to have different thicknesses.

Furthermore, the four color filter layers may include a first color filter layer disposed on one surface of the substrate and a second color layer disposed to be in contact with one side surface of the first color layer, and at least one of the four color filter layers may include one color layer. Accordingly, the first color layer and the second color layer may be disposed side-by-side. Joining two layers having equal dimensions to be disposed to be in contact with a lateral surface of the other produces a composite layer having a constant thickness. Further, at least one of the four color filter layers is a one color layer.

Herein, the first color layer, the second color layer, and the one color layer may have different colors.

Further, a sum of areas of color layers having the same color as the first color layer, a sum of areas of color layers having the same color as the second color layer, and a sum of areas of the one color layers may be the same as each other.

Although an organic light emitting diode display device according to the exemplary embodiments of the present disclosure does not include a polarizing plate, red (R), green (G), and blue (B) color filter layers are alternately disposed on different white (W) sub-pixels in different pixels. Thus, the organic light emitting diode display device reduces reflectance and produces a clear black color. Further, the color filter layers may have different thicknesses and different colors alternately disposed on different white (W) sub-pixels. Thus, the reflectance and black color expression may be tuned further.

In another exemplary embodiment, the organic light emitting diode display device may further comprise a black matrix disposed at a boundary between the color filter layers.

In another exemplary embodiment, the present disclosure provides a method of fabricating the above-mentioned organic light emitting diode display device, wherein the four color filter layers are formed using a half-tone mask.

The fabrication method may further include: fabricating a display device; assessing the color expressed when the display device is in a black state; and adjusting the fabrication method by changing the thickness of at least one of the four color filter layers to improve the appearance of the black state.

BRIEF DESCRIPTION OF THE DRAWINGS

The above and other aspects, features and other advantages of the present disclosure will be more clearly understood from the following detailed description taken in conjunction with the accompanying drawings, in which:

FIG. 10 and FIG. 11 are plan views illustrating various configurations of color layers disposed in a first sub-pixel of an organic light emitting diode display device according to an exemplary embodiment of the present disclosure.

DETAILED DESCRIPTION

Figure 1:
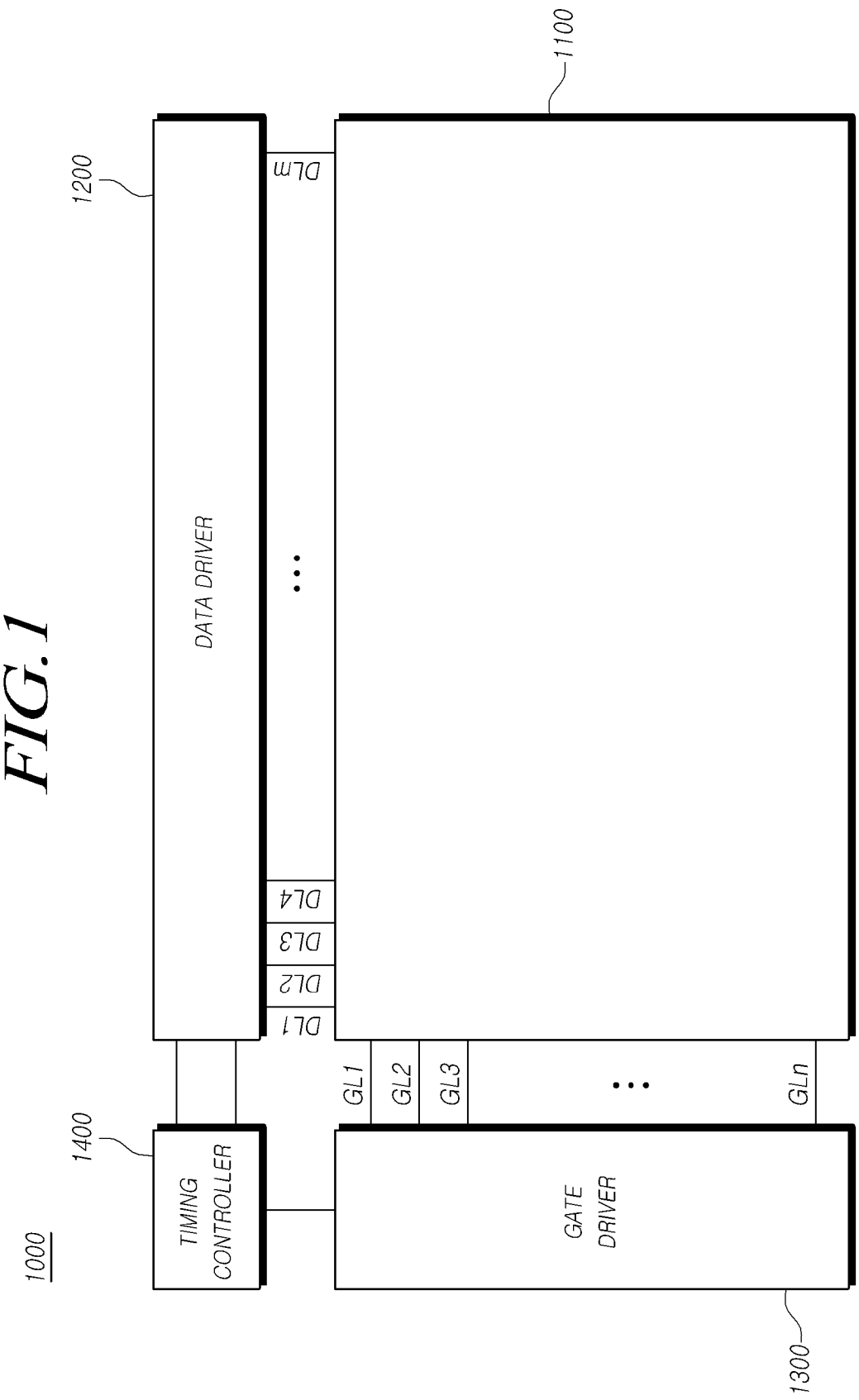
FIG. 1 is a schematic system configuration view of an organic light emitting diode display device according to exemplary embodiments of the present disclosure.

Advantages and features of the present disclosure, and methods for accomplishing the same will be more clearly understood from the exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the invention, and the present disclosure will be defined by the appended claims. Like reference numerals generally denote like elements throughout the present specification. In the drawings, the sizes and relative sizes of layers and regions may be exaggerated for clarity, and ease of explanation.

When an element or layer is referred to as being "on" another element or layer, it may be directly on the other element or layer, or intervening elements or layers may be present. When an element is referred to as being "directly on" another element, intervening elements may not be present.

The spatially-relative terms such as "below", "beneath", "lower", "above", "upper", etc. may be used herein for ease of description to describe the relationship of one element or components with another element(s) or component(s) as illustrated in the drawings. Such spatially relative terms are intended to encompass different orientations of the element in use or operation, in addition to the orientation depicted in the drawings. For example, if the element in the drawings is turned over, elements described as "below" or "beneath" other elements would then be oriented "above" the other elements. Thus, the exemplary term "below" can encompass both an orientation of above and below.

Further, in describing components of the present invention, terms such as first, second, A, B, (a), (b), etc., can be used. These terms are used only to differentiate the components from other components. Therefore, the nature, order, sequence, etc., of the corresponding components are not limited by these terms.

The terms "height" and "thickness" are used interchangeably herein.

FIG. 1 is a schematic system configuration view of an organic light emitting diode display device according to the exemplary embodiments of the present disclosure. Referring to FIG. 1, in an organic light emitting diode display device 1000, a plurality of data lines DL to DLm and a plurality of gate lines GL1 to GLn are disposed. The organic light emitting diode display device 1000 includes an organic light emitting display panel 1100 in which a plurality of sub-pixels is disposed, a data driver 1200 configured to drive the plurality of data lines DL to DLm, a gate driver 1300 configured to drive the plurality of gate lines GL1 to GLn, and a timing controller 1400 configured to control the data driver 1200 and the gate driver 1300.

The data driver 1200 drives the plurality of data lines by supplying a data voltage to the plurality of data lines. The gate driver 1300 sequentially drives the plurality of gate lines by sequentially supplying a scan signal to the plurality of gate lines.

The timing controller 1400 controls the data driver 1200 and the gate driver 1300 by supplying a control signal to the data driver 1200 and the gate driver 1300. The timing controller 1400 starts a scan according to timing implemented in each frame, converts image data input from the outside to a suitable data signal used by the data driver 1200, outputs the converted image data, and controls the driving of data at a proper time corresponding to the scan.

The gate driver 1300 sequentially drives the plurality of gate lines by sequentially supplying an ON voltage or OFF voltage scan signal to the plurality of gate lines according to the control the signal provided by the timing controller 1400. The gate driver 1300 may be located at only one side of the organic light emitting display panel 1100, as illustrated in FIG. 1, or may be located at both sides thereof if necessary based on the driving method or the design of the organic light emitting display panel.

Further, the gate driver 1300 may include one or more gate driver integrated circuits. Each gate driver integrated circuit may be connected to a bonding pad of the organic light emitting display panel 1100 through a Tape Automated Bonding (TAB) method or a Chip On Glass (COG) method, or implemented as a Gate In Panel (GIP) type and directly disposed in the organic light emitting display panel 1100, or may be integrated and disposed in the organic light emitting display panel 1100, as necessary.

Alternatively, each gate driver integrated circuit may be implemented as a Chip On Film (COF) type. In such a case, a gate driving chip corresponding to each gate driver integrated circuit may be mounted on a flexible film, and one end of the flexible film may be bonded to the organic light emitting display panel 1100.

If a specific gate line is open, the data driver 1200 converts image data received from the timing controller 1400 into analog data voltage and supplies the data voltage to drive the plurality of data lines. Further, the data driver 1200 may include at least one source driver integrated circuit to drive the plurality of data lines.

Each source driver integrated circuit may be connected to the bonding pad of the organic light emitting display panel 1100 through a Tape Automated Bonding (TAB) method or a Chip On Glass (COG) method, or may be directly disposed in the organic light emitting display panel 1100, or may be integrated and disposed in the organic light emitting display panel 1100 if necessary.

Alternatively, each source driver integrated circuit may be implemented as a Chip On Film (COF) type. In such a case, a source driving chip corresponding to each source driver integrated circuit may be mounted on a flexible film, and one end of the flexible film may be bonded to at least one source printed circuit board and the other end thereof may be bonded to the organic light emitting display panel 1100.

The source printed circuit board may be connected to a control printed circuit board through a connector such as a flexible flat cable (FFC) or a flexible printed circuit (FPC). The timing controller 1400 is disposed in the control printed circuit board.

Further, in the control printed circuit board, a power controller (not illustrated) configured to supply a voltage or current to the organic light emitting display panel 1100, the data driver 1200, and the gate driver 1300 or control a voltage or current to be supplied thereto may be further disposed. The above-described source printed circuit board and control printed circuit board may be formed as one printed circuit board.

In the exemplary embodiments of the present disclosure, a pixel includes one or more sub-pixels. For example, in the present exemplary embodiments, one pixel may include two or four sub-pixels. Colors defined in the sub-pixels may selectively include red (R), green (G), blue (B), and white (W), but the present exemplary embodiments are not limited thereto. However, one pixel of the organic light emitting diode display device 1000 according to such exemplary embodiments may include at least one white (W) sub-pixel.

Further, an organic light emitting diode according to the exemplary embodiments of the present disclosure may include a first electrode, an organic light emitting layer, and a second electrode. The organic light emitting layer may be disposed in each sub-pixel or may be disposed on the entire surface of a lower substrate.

Herein, an electrode connected to a thin film transistor for controlling emission of each sub-pixel in the organic light emitting display panel 1100 is referred to as the first electrode, and an electrode disposed on the entire surface of the display panel or disposed to include two or more pixels is referred to as the second electrode. If the first electrode is an anode electrode, the second electrode is a cathode electrode, and vice versa. In the following descriptions, the first electrode will be described as an anode electrode and the second electrode will be described as a cathode electrode in an exemplary embodiment, but the present disclosure is not limited thereto.

Figure 2:
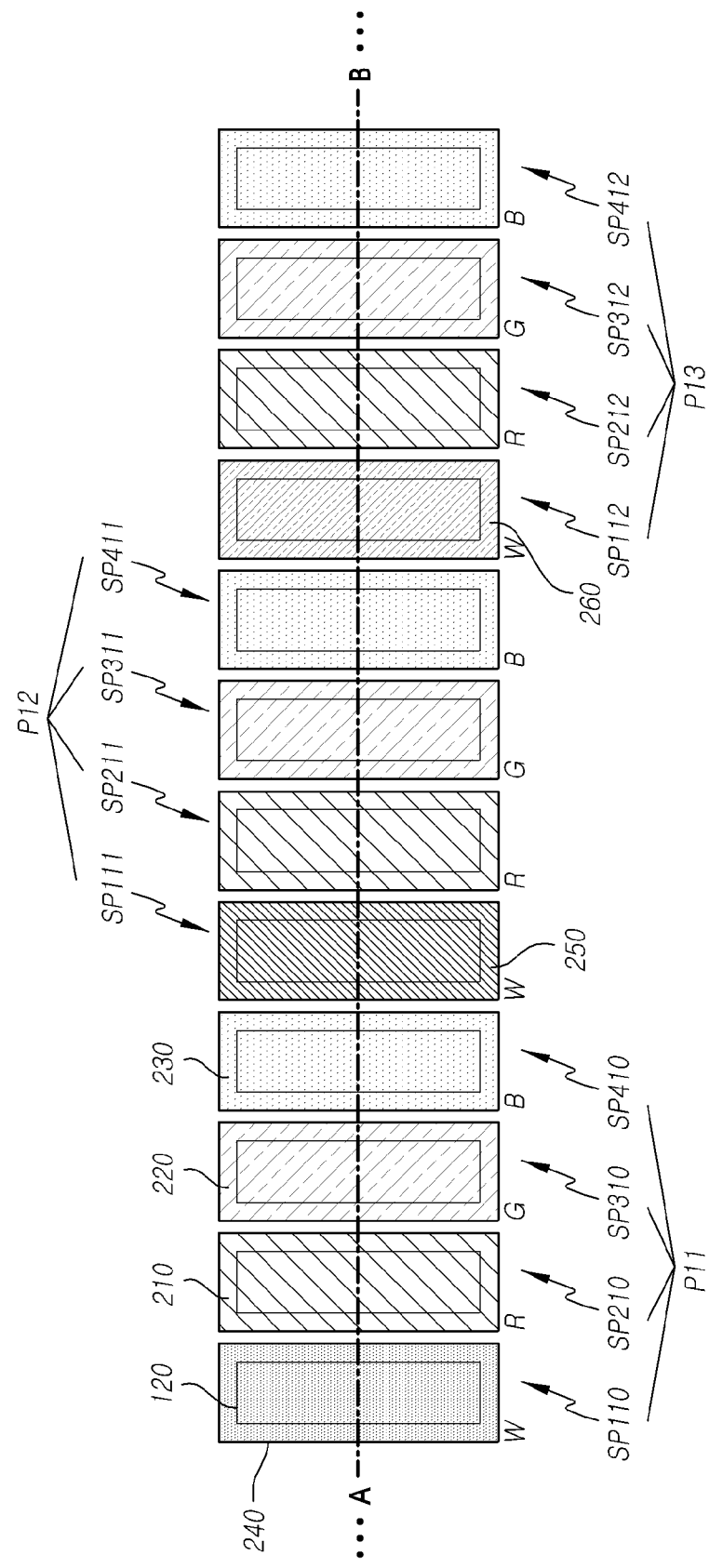
FIG. 2 is a schematic plan view of an organic light emitting diode display device according to a first exemplary embodiment of the present disclosure.

FIG. 2 is a schematic plan view of an organic light emitting diode display device according to a first exemplary embodiment. Referring to FIG. 2, the organic light emitting diode display device according to the first exemplary embodiment includes a plurality of pixels P11, P12, P13, and the like, and each of the plurality of pixels P11, P12, P13, and the like, includes a plurality of sub-pixels.

Although the figures of the present disclosure illustrate only the configurations of three pixels in each exemplary embodiment, the present disclosure is not limited thereto, and the three illustrated pixels may be repeatedly provided within a display region of the organic light emitting diode display device according to the exemplary embodiments of the present disclosure.

The plurality of pixels P11, P12, and P13 illustrated in FIG. 2 will be described below. Each of the pixels P11, P12, and P13 may include four sub-pixels. For example, a first pixel P11 may include a first sub-pixel SP110, a second sub-pixel SP210, a third sub-pixel SP310, and a fourth sub-pixel SP410; a second pixel P12 may include a first sub-pixel SP111, a second sub-pixel SP211, a third sub-pixel SP311, and a fourth sub-pixel SP411; and a third pixel P13 may include a first sub-pixel SP112, a second sub-pixel SP212, a third sub-pixel SP312, and a fourth sub-pixel SP412.

Further, the first sub-pixels SP110, SP111, and SP112 may be white (W) sub-pixels, the second sub-pixels SP210, SP211, and SP212 may be red (R) sub-pixels, the third sub-pixels SP310, SP311, and SP312 may be green (G) sub-pixels, and the fourth sub-pixels SP410, SP411, and SP412 may be blue (B) sub-pixels. In FIG. 2, the sub-pixels in each of the pixels P11, P12, and P13 are sequentially disposed as white (W), red (R), green (G), and blue (B) sub-pixels. However, the organic light emitting diode display device is not limited thereto, and the sub-pixels may be disposed in various sequences.

The organic light emitting diode display device according to the first exemplary embodiment is disposed on a first substrate (not illustrated). An organic light emitting diode including a first electrode 120, a white (W) organic light emitting layer (not illustrated) configured to generate a white (W) light, and a second electrode (not illustrated) may be disposed in each sub-pixel. Further, on one surface of a second substrate (not illustrated) disposed to face the first substrate (not illustrated), color filter layers 210, 220, 230, 240, 250, and 260 may be disposed corresponding to the sub-pixels.

For example, a first color filter layer 210 may be disposed corresponding to the second sub-pixels SP210, SP211, and SP212 of the respective pixels. A second color filter layer 220 may be disposed corresponding to the third sub-pixels SP310, SP311, and SP312 of the respective pixels. A third color filter layer 230 may be disposed corresponding to the fourth sub-pixels SP410, SP411, and SP412 of the respective pixels. Herein, the first color filter layer 210 may be a red (R) color filter layer, the second color filter layer 220 may be a green (G) color filter layer, and the third color filter layer 230 may be a blue (B) color filter layer.

A polarizing plate may be provided on or under the display panel depending on an emission method of an organic light emitting display panel. The polarizing plate disposed on or under the display panel may include a linear polarizing plate and a circular polarizing plate, which reduces external light reflection to improve visibility of the organic light emitting diode display device. However, polarizing plates are expensive and cause a decrease in brightness of the organic light emitting diode display device, and thus, power consumption may increase to improve the brightness of the organic light emitting diode display device.

If the polarizing plate is not disposed on or under the organic light emitting display panel, the reflectance may be increased. However, the first to third color filter layers 210, 220, and 230 disposed corresponding to the second sub-pixels SP210, SP211, and SP212, the third sub-pixels SP310, SP311, and SP312, and the fourth sub-pixels SP410, SP411, and SP412 absorb external light, and, thus, the reflectance of the these sub-pixels may decrease. On the other hand, due to the reflection of external light by the electrodes disposed in the first sub-pixels SP110, SP111, and SP112, the overall reflectance of the organic light emitting diode display device may be increased.

The organic light emitting diode display device according to the first exemplary embodiment is designed to solve this problem by including fourth to sixth color filter layers 240, 250, and 260 disposed in the first sub-pixels SP110, SP111, and SP112, respectively.

For example, the fourth color filter layer 240 may be disposed corresponding to the first sub-pixel SP110 of the first pixel P11, the fifth color filter layer 250 may be disposed corresponding to the first sub-pixel SP111 of the second pixel P12, and the sixth color filter layer 260 may be disposed corresponding to the first sub-pixel SP112 of the third pixel P13. Herein, the fourth to sixth color filter layers 240, 250, and 260 may be formed of color filter layers having different colors selected from red (R), green (G), and blue (B) colors.

For example, as illustrated in FIG. 2, the fourth color filter layer 240 may be a blue (B) color filter layer, the fifth color filter layer 250 may be a red (R) color filter layer, and the sixth color filter layer 260 may be a green (G) color filter layer. However, the organic light emitting diode display device according to the first exemplary embodiment is not limited thereto as long as the fourth to sixth color filter layers 240, 250, and 260 are color filter layers having different colors.

Herein, the fourth to sixth color filter layers 240, 250, and 260 may have a smaller thickness than the first to third color filter layers 210, 220, and 230, where the thickness of a layer is the shortest distance between the upper surface of the layer and the lower surface of the layer. Accordingly, external light reflection in the first sub-pixels SP110, SP111, and SP112 is reduced, and black color expression is improved. This configuration will be described in detail with reference to FIG. 3.

Figure 3:
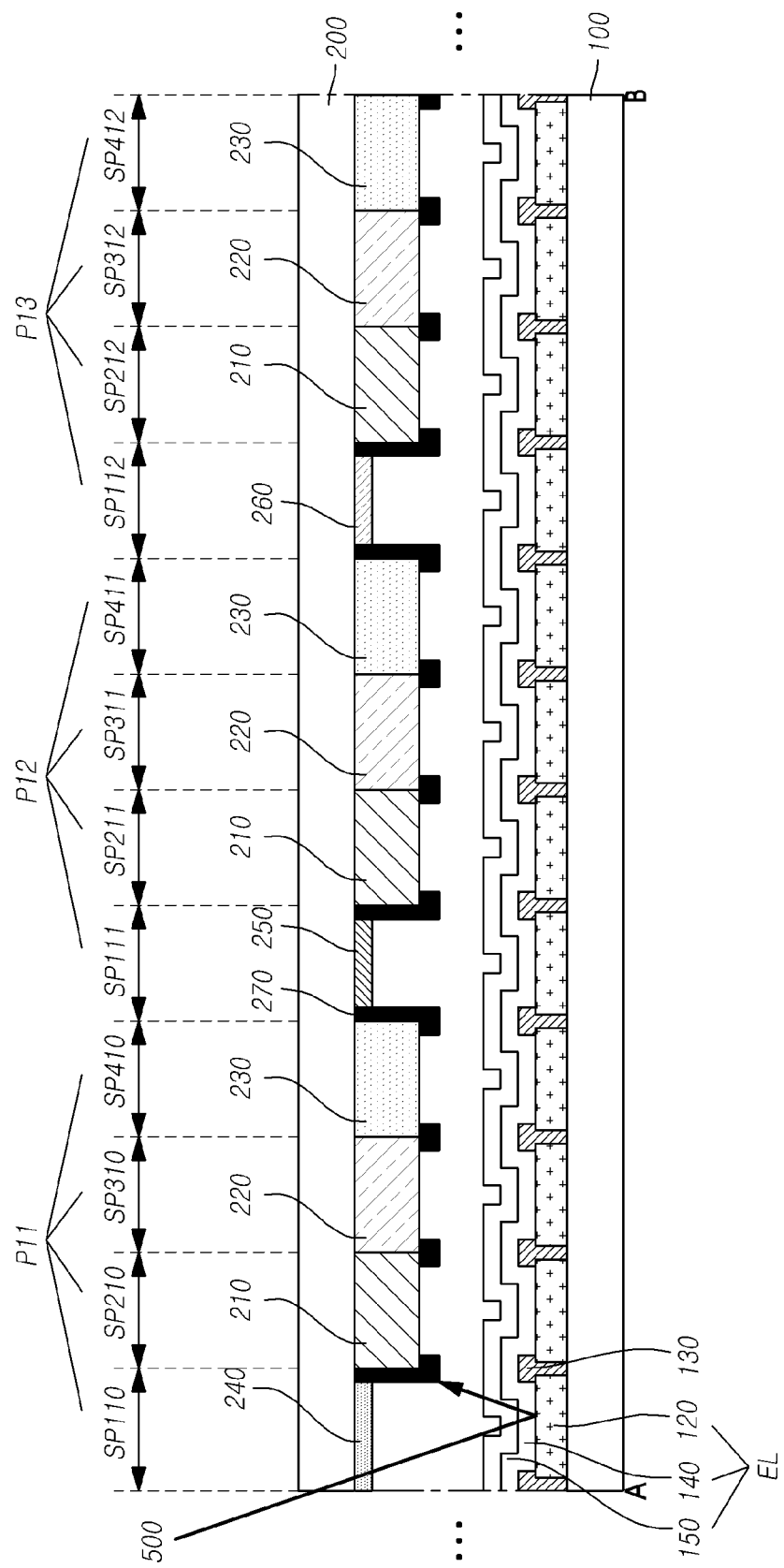
FIG. 3 is a cross-sectional view along a line A-B of the organic light emitting diode display device illustrated in FIG. 2.

FIG. 3 is a cross-sectional view along a line A-B of the organic light emitting diode display device illustrated in FIG. 2. The first substrate 100 is divided into a plurality of sub-pixels. At least one thin film transistor (not illustrated) may be disposed on each sub-pixel of the first substrate 100. Further, an organic light emitting diode EL electrically connected to the thin film transistor (not illustrated) may be disposed on the first substrate 100.

The organic light emitting diode EL may include a first electrode 120, an organic light emitting layer 140, and a second electrode 150. Further, a bank pattern 130 that defines an emission area and a non-emission area may be disposed on a part of a top surface of the first electrode 120.

The first electrode 120 may be a reflective electrode, and the second electrode 150 may be formed of a transparent conductive material, and vice versa. Further, the organic light emitting layer 140 may be an organic light emitting layer that emits a white (W) light.

FIG. 3 illustrates that the first electrode 120, all of the organic light emitting layer 140, and the second electrode 150 are monolayers, but the organic light emitting diode EL according to the first exemplary embodiment is not limited thereto. At least one element may be formed of a multilayer.

Further, the organic light emitting diode display device according to the first exemplary embodiment includes a second substrate 200 disposed to face the first substrate 100. One surface of the second substrate 200 includes the color filter layers 210, 220, 230, 240, 250, and 260 disposed corresponding to a plurality of sub-pixels, respectively, and a black matrix 270 disposed at boundaries between the color filter layers 210, 220, 230, 240, 250, and 260.

For example, the first color filter layer 210 may be disposed corresponding to the second sub-pixels SP210, SP211, and SP212, the second color filter layer 220 may be disposed corresponding to the third sub-pixels SP310, SP311, and SP312, the third color filter layer 230 may be disposed corresponding to the fourth sub-pixels SP410, SP411, and SP412, the fourth color filter layer 240 may be disposed corresponding to the first sub-pixel SP110, the fifth color filter layer 250 may be disposed corresponding to the first sub-pixel SP111, and the sixth color filter layer 260 may be disposed corresponding to the first sub-pixel SP112.

The first to third color filter layers 210, 220, and 230 may have a greater thickness than the fourth to sixth color filter layers 240, 250, and 260. For example, if the first to third color filter layers 210, 220, and 230 have a thickness of 2 μm to 3 μm, the fourth to sixth color filter layers 240, 250, and 260 may have a thickness of 0.1 μm to 1 μm.

It is possible to reduce external light reflection in the first sub-pixels SP110, SP111, and SP112 of the respective pixels without increasing power consumption, because the fourth to sixth color filter layers 240, 250, and 260 disposed in a region corresponding to the first sub-pixels SP110, SP111, and SP112 of the respective pixels have a smaller thickness than the first to third color filter layers 210, 220, and 230.

For example, if the color filter layers 240, 250, and 260 disposed in the first sub-pixels SP110, SP111, and SP112, respectively, are thick, an absorption ratio of an external light 500 incident into the organic light emitting diode display device increases. However, a white (W) light generated from the organic light emitting diode EL is absorbed by the color filter layers 240, 250, and 260. Thus, the efficiency of the organic light emitting diode EL is decreased.

However, in the organic light emitting diode display device according to the first exemplary embodiment, when the fourth to sixth color filter layers 240, 250, and 260 have a smaller thickness than the first to third filter layers 210, 220, and 230, it is possible to suppress a decrease in efficiency of the organic light emitting diode EL and absorb the external light 500.

Further, the color filter layers 240, 250, and 260 disposed in the region corresponding to the first sub-pixels SP110, SP111, and SP112, respectively, of the adjacent pixels have different colors. Thus, black color expression can be improved when the organic light emitting diode display device is in an OFF state.

For example, the fourth color filter layer 240 may be disposed in the first sub-pixel SP110, the fifth color filter layer 250 may be disposed in the first sub-pixel SP111, the sixth color filter layer 260 may be disposed in the first sub-pixel SP112, and the fourth to sixth color filter layers 240, 250, and 260 may transmit light having different wavelengths.

Herein, the fourth color filter layer 240 may transmit light having a wavelength between 450 nm and 470 nm and absorb light having a different wavelength within this same range, the fifth color filter layer 250 may transmit light having a wavelength between 620 nm and 640 nm and absorb light having a different wavelength within this same range, and the sixth color filter layer 260 may transmit light having a wavelength between 520 nm and 560 nm and absorb light having a different wavelength within this same range.

Therefore, if the external light 500 having a visible light wavelength is incident on the second substrate 200 of the organic light emitting diode display device, the first sub-pixel SP110 transmits light having a wavelength between 450 nm and 470 nm and absorbs light having a different wavelength within this same range. Further, light having a wavelength of 450 nm to 470 nm and incident on the first sub-pixel SP110 is reflected by a reflective electrode (the first electrode or the second electrode according to the emission method) of the organic light emitting diode EL and the path of the light changes toward the second substrate 200.

Most of the light having a wavelength of 450 nm to 470 nm and reflected by the reflective electrode of the organic light emitting diode EL is absorbed by the black matrix 270 or another adjacent color filter layer (for example, the first color filter layer 210 or the third color filter layer 230). Further, the fourth color filter layer 240 may transmit a very small amount of the rest of the light having a wavelength of 450 nm to 470 nm so as to be emitted to the outside of the second substrate 200.

Further, the path of the external light 500 incident on the first sub-pixel SP111 of the second pixel P12 and the first sub-pixel SP112 of the third pixel P13 may be the same as the path of the external light 500 incident into the first sub-pixel SP110 of the first pixel P11. However, the external light 500 absorbed or emitted by the first sub-pixel SP111 and the first sub-pixel SP112 may have wavelengths between 620 nm and 640 nm and between 520 nm and 560 nm, respectively.

As described above, the fourth color filter layer 240, the fifth color filter layer 250, and the sixth color filter layer 260 are provided in the first sub-pixels SP110, SP111, and SP112 of the respective pixels. Thus, most of the external light is absorbed, thereby improving black color expression.

Further, each of the first to sixth color filter layers 210, 220, 230, 240, 250, and 260 disposed in the respective sub-pixels has any one color selected from red (R), green (G), or blue (B) and is formed using a half-tone mask. Thus, a color filter layer having a different thickness can be formed without any additional processing. That is, regardless of the thicknesses of the first to sixth color filter layers 210, 220, 230, 240, 250, and 260, the color filter layers having the same color can be formed by the same process. Therefore, it is possible to simplify the production process.

The color filter layers provided in the first sub-pixels SP110, SP111, and SP112 of the respective pixels are not limited to those illustrated in FIG. 2 and FIG. 3, and may be provided in different forms. Details thereof will be described below with reference to FIG. 4 and FIG. 5.

Figure 4:
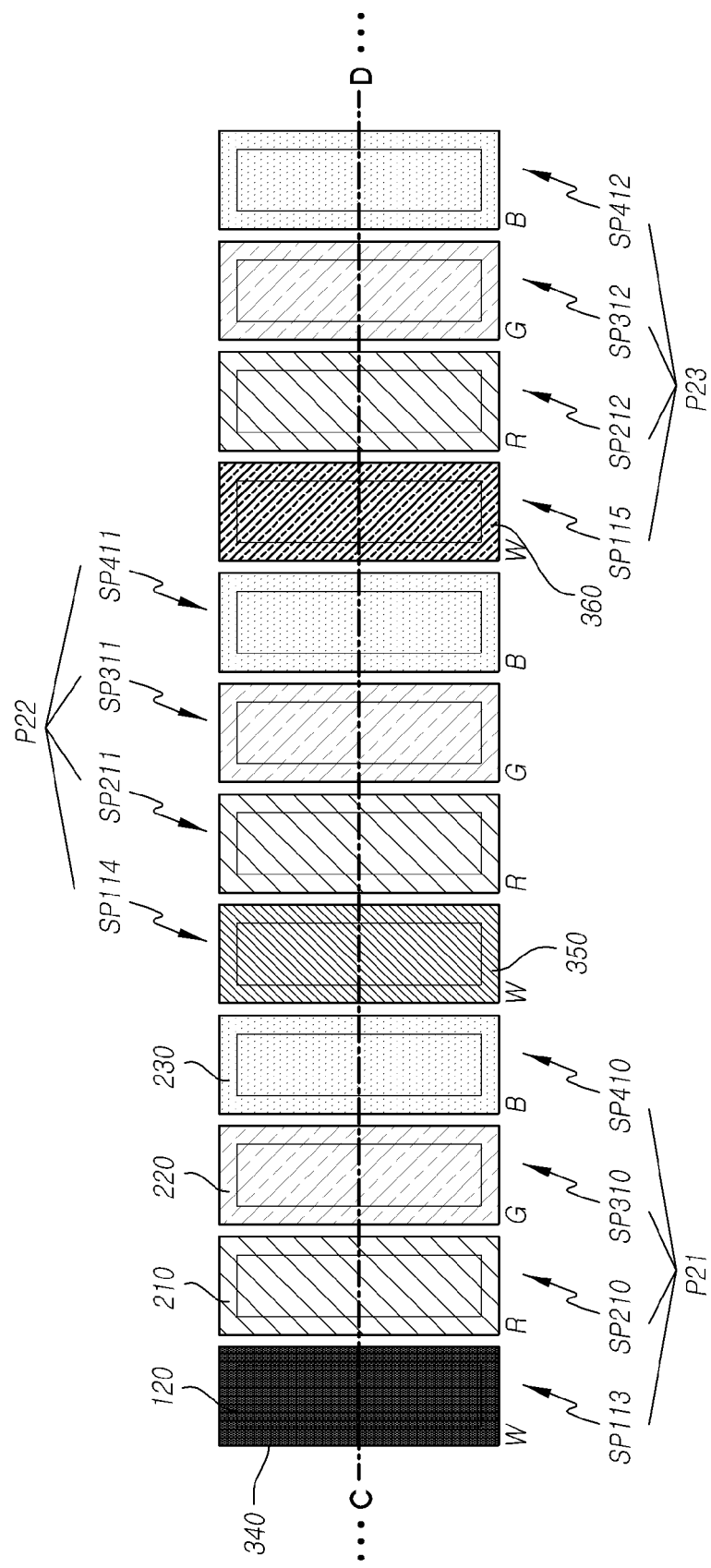
FIG. 4 is a schematic plan view of an organic light emitting diode display device according to a second exemplary embodiment of the present disclosure.
Figure 5:
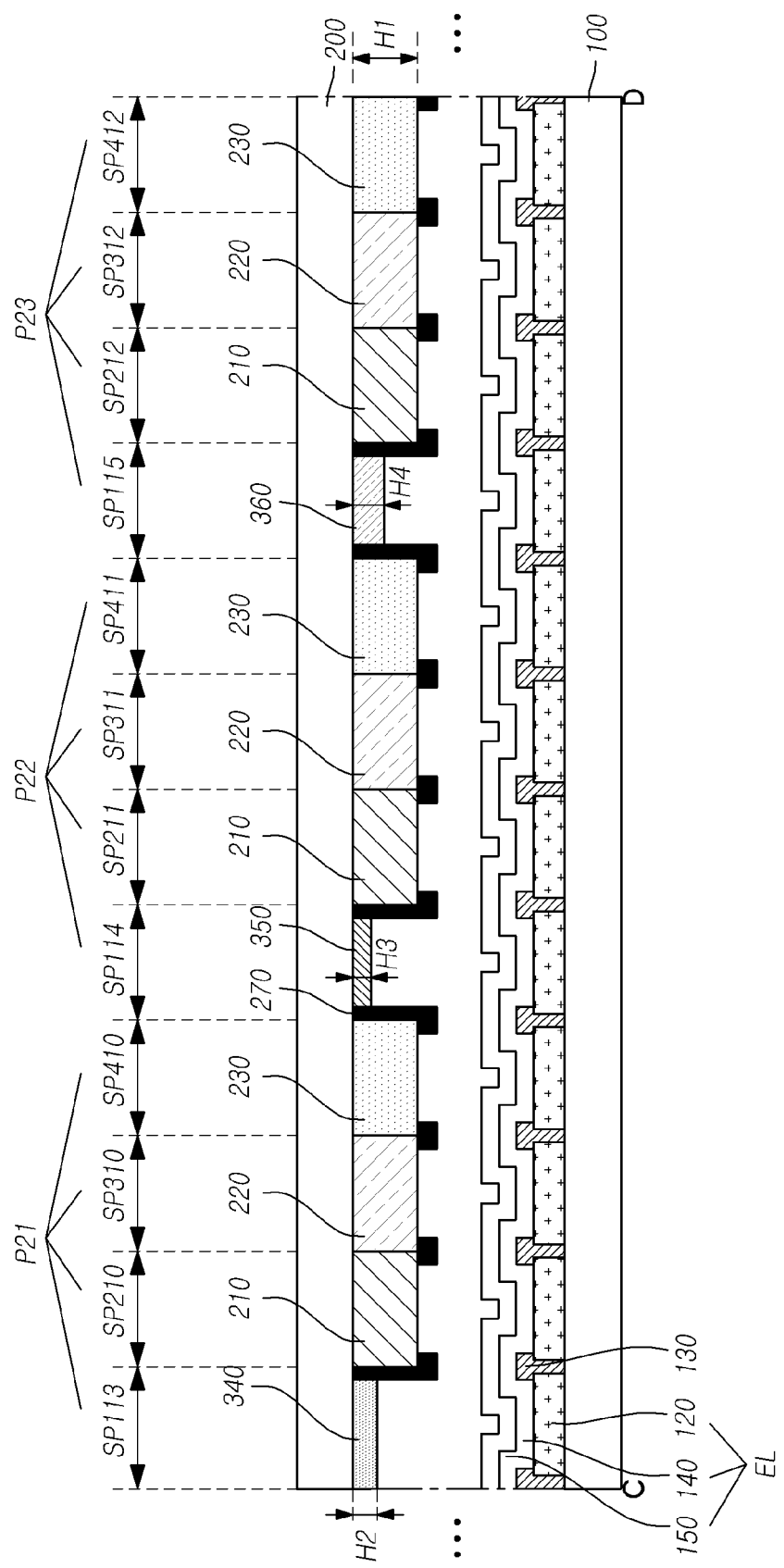
FIG. 5 is a cross-sectional view along a line C-D of the organic light emitting diode display device illustrated in FIG. 4.

FIG. 4 is a schematic plan view of an organic light emitting diode display device according to a second exemplary embodiment, and FIG. 5 is a cross-sectional view along a line C-D of the organic light emitting diode display device illustrated in FIG. 4. The organic light emitting diode display device according to this exemplary embodiment may include the same components as those of the above-described first exemplary embodiment. Like components are assigned like reference numerals, and redundant descriptions thereof may be omitted for brevity.

Referring to FIG. 4, the organic light emitting diode display device according to the second exemplary embodiment includes a plurality of pixels P21, P22, and P23, and each of the pixels includes a plurality of sub-pixels.

For example, a first pixel P21 of the organic light emitting diode display device according to the second exemplary embodiment includes a first sub-pixel SP113, a second sub-pixel SP210, a third sub-pixel SP310, and a fourth sub-pixel SP410; a second pixel P22 includes a first sub-pixel SP114, a second sub-pixel SP211, a third sub-pixel SP311, and a fourth sub-pixel SP411; and a third pixel P23 includes a first sub-pixel SP115, a second sub-pixel SP212, a third sub-pixel SP312, and a fourth sub-pixel SP412.

Herein, the first color filter layer 210 may be disposed corresponding to the second sub-pixels SP210, SP211, and SP212, the second color filter layer 220 may be disposed corresponding to the third sub-pixels SP310, SP311, and SP312, and the third color filter layer 230 may be disposed corresponding to the fourth sub-pixels SP410, SP411, and SP412.

A fourth color filter layer 340, a fifth color filter layer 350, and a sixth color filter layer 360 may be further disposed corresponding to the first sub-pixels SP113, SP114, and SP115 of the pixels, respectively.

Herein, the fourth to sixth color filter layers 340, 350, and 360 may have a smaller height than the first to third color filter layers 210, 220, and 230. Further, at least two of the fourth to sixth color filter layers 340, 350, and 360 may have different heights.

This configuration will be described in further detail with reference to FIG. 5. In FIG. 5, the first color filter layer 210 is disposed in the second sub-pixels SP210, SP211, and SP212, the second color filter layer 220 is disposed in the third sub-pixels SP310, SP311, and SP312 and the third color filter layer 230 disposed in the fourth sub-pixels SP410, SP411, and SP412, and the first, second and third color filter layers may have the same height H1.

Further, heights H2, H3, and H4 of the fourth to sixth color filter layers 340, 350, and 360 disposed in the first sub-pixels SP113, SP114, and SP115, respectively, may be smaller than the height H1 of the first to third color filter layers 210, 220, and 230. Thus, it is possible to improve the efficiency of the organic light emitting diode EL1 and reduce the reflectance at the first sub-pixels SP113, SP114, and SP115.

FIG. 5 illustrates a configuration in which the first to third color filter layers 210, 220, and 230 have the same height H1. However, the organic light emitting diode display device according to the second exemplary embodiment is not limited thereto as long as the height H1 of the first to third color filter layers 210, 220, and 230 is greater than the heights H2, H3, and H4 of the fourth to sixth color filter layers 340, 350, and 360, respectively.

Further, at least two of the heights H2 of the fourth color filter layer 340, H3 of the fifth color filter layer 350, and H4 of the sixth color filter layer 360 may be different from each other. For example, the height H2 of the fourth color filter layer 340 may be identical to the height H4 of the sixth color filter layer 360, and the height H3 of the fifth color filter layer 350 may be smaller than the height H2 of the fourth color filter layer 340 and the height H4 of the sixth color filter layer 360. This is just an example of the organic light emitting diode display device according to the second exemplary embodiment, and is not limited thereto, as long as at least two of the heights H2, H3, and H4 of the fourth to sixth color filter layers 340, 350, and 360, respectively, are different from each other.

As described above, at least two of the heights H2, H3, and H4 of the fourth to sixth color filter layers 340, 350, and 360, respectively, may be different from each other. Further, in the organic light emitting diode display device according to the second exemplary embodiment, the first to third pixels P21, P22, and P23 may be repeatedly provided. Thus, it is possible to finely tune black color expression and optimize reflectance of the organic light emitting diode display device.

For example, if a bluish color is expressed when the organic light emitting diode display device is in a black state, it is possible to enhance black color expression by setting the thickness H2 of the fourth color filter layer 340 disposed in the first sub-pixel SP113 of the first pixel P21 to be greater than the thicknesses H3 and H4 of the fifth color filter layer 350 and the sixth color filter layer 360, respectively. For example, an amount of an external light incident into the first sub-pixel SP113 of the first pixel P21 may be decreased because the fourth color filter layer 340 disposed in the first sub-pixel SP113 of the first pixel P21 has a greater thickness H2 than the thicknesses of the fifth and sixth color filter layers.

That is, an amount of an external light incident on the first sub-pixel SP113 of the first pixel P21, i.e., a light passing through the fourth color filter layer 340 in the first sub-pixel SP113 and having a wavelength of 450 nm to 470 nm decreases, and an amount of light (having a wavelength of 450 nm to 470 nm) reflected by the electrodes disposed in the first sub-pixel SP113 and emitted to the outside of the organic light emitting diode display device is reduced. Therefore, when the organic light emitting diode display device is in a black state, it is possible to suppress bluish color expression and reduce reflectance.

Although first sub-pixel SP113 of the first pixel has been described above, the organic light emitting diode display device according to the second exemplary embodiment is not limited thereto. Among the plurality of pixels, the height H2 of the fourth color filter layer 340 may be set to be greater than the height H3 or H4 of the fifth or sixth color filter layer 350 or 360, respectively.

Further, if a reddish color is expressed when the organic light emitting diode display device is in a black state, the height H3 of the fifth color filter layer 350 may be set to be greater than the height H2 or H4 of the fourth or sixth color filter layer 340 or 360, respectively. Furthermore, if a greenish color is expressed when the organic light emitting diode display device is in a black state, the height H4 of the sixth color filter layer 360 may be set to be greater than the height H2 or H3 of the fourth or fifth color filter layer 340 or 350, respectively.

Figure 6:
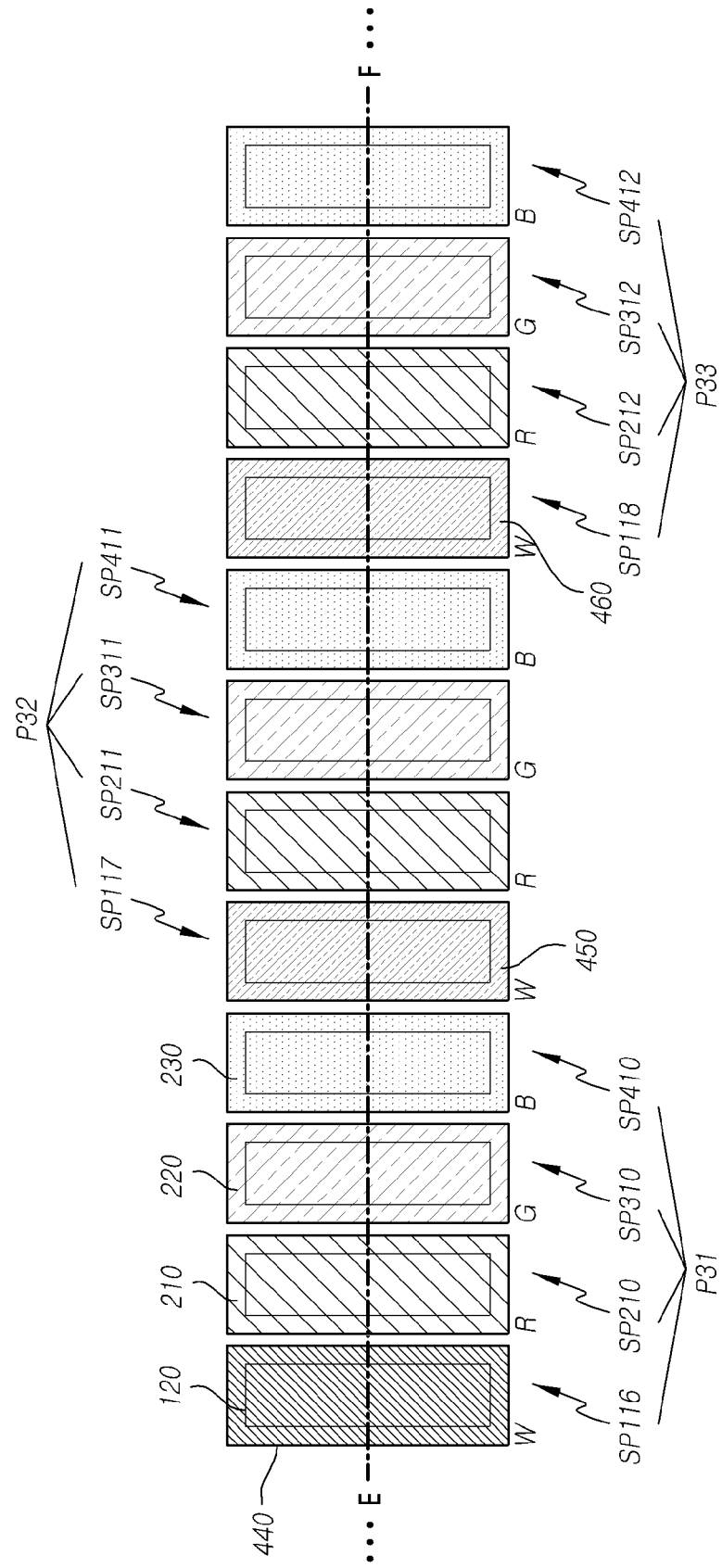
FIG. 6 is a schematic plan view of an organic light emitting diode display device according to a third exemplary embodiment of the present disclosure.
Figure 7:
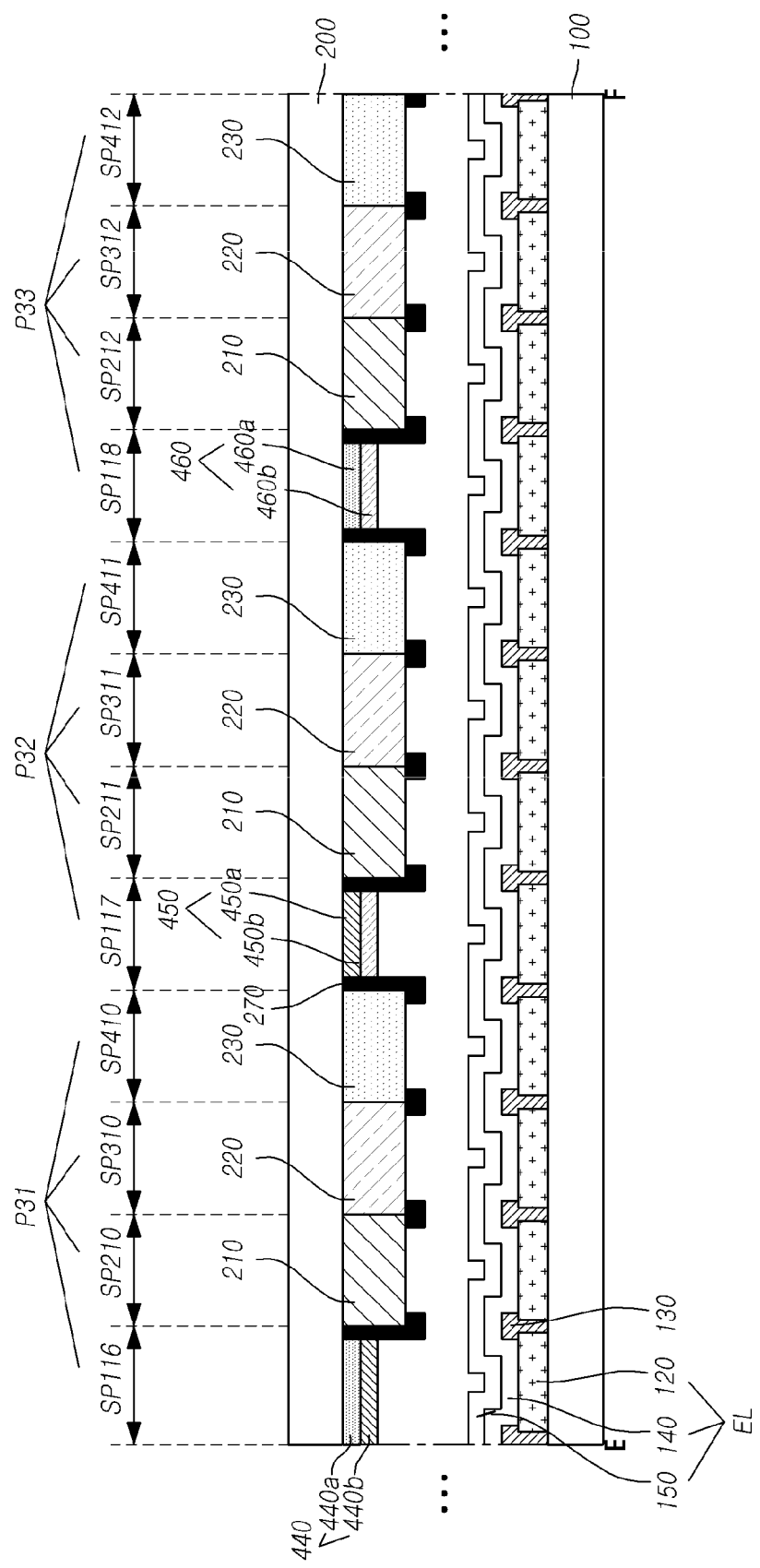
FIG. 7 is a cross-sectional view along a line E-F of the organic light emitting diode display device illustrated in FIG. 6.

Hereinafter, an organic light emitting diode display device according to a third exemplary embodiment will be described below with reference to FIG. 6 and FIG. 7. FIG. 6 is a schematic plan view of the organic light emitting diode display device according to the third exemplary embodiment. FIG. 7 is a cross-sectional view along a line E-F of the organic light emitting diode display device illustrated in FIG. 6.

The organic light emitting diode display device according to the third exemplary embodiment may include the same components as those of the first and second exemplary embodiments. Like components are assigned like reference numerals, and redundant descriptions thereof may be omitted for brevity.

Referring to FIG. 6, the organic light emitting diode display device according to the third exemplary embodiment includes a plurality of pixels P31, P32, and P33, and each of these pixels includes a plurality of sub-pixels.

For example, a first pixel P31 of the organic light emitting diode display device according to the third exemplary embodiment includes a first sub-pixel SP116, a second sub-pixel SP210, a third sub-pixel SP310, and a fourth sub-pixel SP410; a second pixel P32 includes a first sub-pixel SP117, a second sub-pixel SP211, a third sub-pixel SP311, and a fourth sub-pixel SP411; a third pixel P33 includes a first sub-pixel SP118, a second sub-pixel SP212, a third sub-pixel SP312, and a fourth sub-pixel SP412.

Herein, a fourth color filter layer 440, a fifth color filter layer 450, and a sixth color filter layer 460 may also be disposed corresponding to the first sub-pixels SP116, SP117, and SP118 of the pixels, respectively.

At least one of the fourth to sixth color filter layers 440, 450, and 460 may be formed by laminating two or more different color layers. This configuration will be described in detail with reference to FIG. 7.

In FIG. 7, at least one of the fourth color filter layer 440, the fifth color filter layer 450, and the sixth color filter layer 460 disposed in the first sub-pixels SP116, SP117, and SP118, respectively, may be formed by laminating two or more different color layers.

For example, FIG. 7 illustrates that all of the fourth color filter layer 440, the fifth color filter layer 450, and the sixth color filter layer 260 are formed by laminating two different color layers. To be specific, the fourth color filter layer 440 may be formed of a first color layer 440a disposed on one surface of the second substrate 200 and a second color layer 440b disposed on the first color layer 440a. Further, for example, the first color layer 440a may be a blue (B) color layer and the second color layer 440b may be a red (R) color layer, but the first and second color layers 440a and 440b are not limited thereto as long as the first and second color layers 440a and 440b, respectively, have different colors.

Accordingly, the reflectance of the organic light emitting diode display device can be minimized. Namely, the fourth color filter layer 440 absorbs light having a wavelength between 450 nm and 470 nm and between 620 nm and 640 nm from among the light incident from the outside of the organic light emitting diode display device, thereby reducing reflectance.

Further, the fifth color filter layer 450 may be formed of a third color layer 450a disposed on one surface of the second substrate 200 and a fourth color layer 450b disposed on the third color layer 450a. The third color layer 450a may be a red (R) color layer and the fourth color layer 450b may be a green (G) color layer, but the third and fourth color layers 450a and 450b are not limited thereto as long as the third and fourth color layers 450a and 450b, respectively, have different colors.

Accordingly, the fifth color filter layer 450 absorbs light having a wavelength between 520 nm and 560 nm and between 620 nm and 640 nm from among the light incident from the outside of the organic light emitting diode display device, thereby reducing reflectance.

Further, the sixth color filter layer 460 may be formed of a fifth color layer 460a disposed on one surface of the second substrate 200 and a sixth color layer 460b disposed on the fifth color layer 460a. For example, the fifth color layer 460a may be a blue (B) color layer and the sixth color layer 460b may be a green (G) color layer, but the fifth and sixth color layers 460a and 460b are not limited thereto as long as the fifth and sixth color layers 460a and 460b respectively have different colors.

Accordingly, the sixth color filter layer 460 absorbs light having a wavelength between 450 nm and 470 nm and between 520 nm and 560 nm from among the light incident from the outside of the organic light emitting diode display device, thereby reducing reflectance.

FIG. 2 to FIG. 7 illustrate that the pixels in each of the organic light emitting diode display devices according to the first to third exemplary embodiments are disposed in a horizontal direction. However, the present exemplary embodiments are not limited thereto, and the pixels may be disposed in a vertical direction.

Further, the heights of the fourth to sixth color filter layers 440, 450, and 460 formed by laminating at least two color layers may be smaller than the heights of the first to third color filter layers 210, 220, and 230. Thus, it is possible to decrease the reflectance without reducing the brightness.

Hereinafter, an organic light emitting diode display device according to a fourth exemplary embodiment will be described below with reference to FIG. 8 to FIG. 11. The organic light emitting diode display device according to the fourth exemplary embodiment may include the same components as those of the above-described exemplary embodiments. Like components are assigned like reference numerals, and redundant descriptions thereof may be omitted for brevity.

Figure 8:
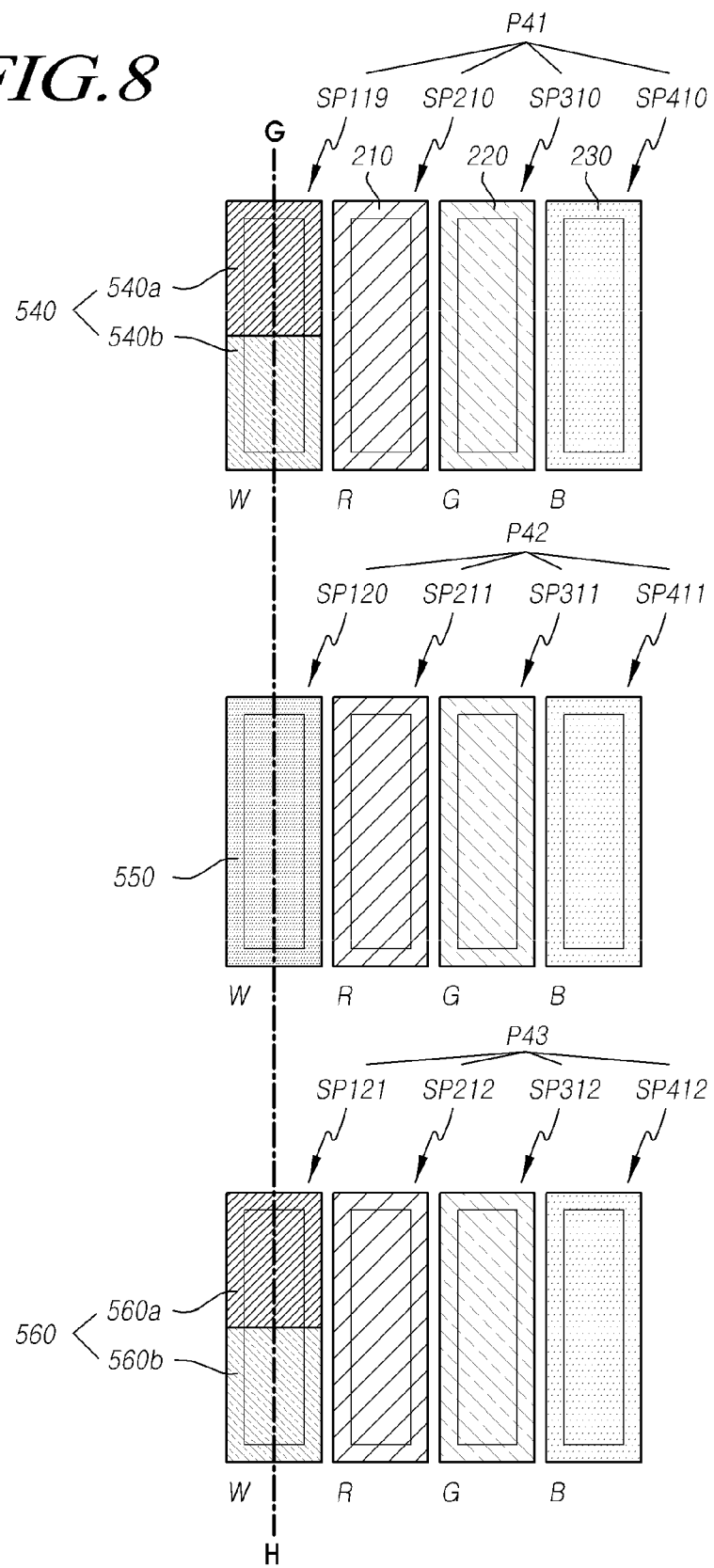
FIG. 8 is a schematic plane view of an organic light emitting diode display device according to a fourth exemplary embodiment of the present disclosure.
Figure 9:
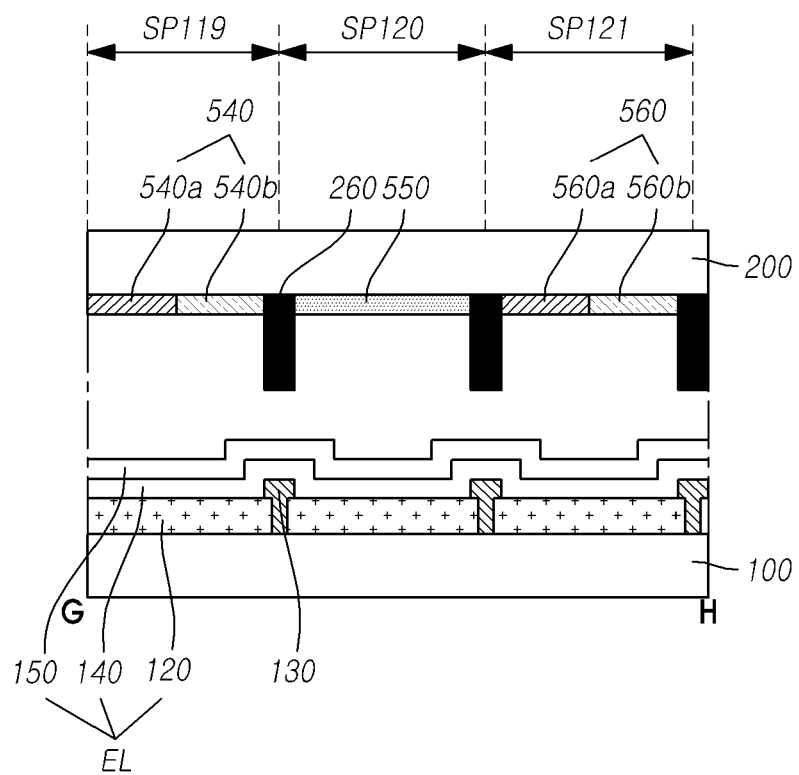
FIG. 9 is a cross-sectional view along a line G-H of the the organic light emitting diode display device illustrated in FIG. 8.

FIG. 8 is a schematic plan view of the organic light emitting diode display device according to the fourth exemplary embodiment. FIG. 9 is a cross-sectional view along a line G-H of the organic light emitting diode display device illustrated in FIG. 8. Referring to FIG. 8 and FIG. 9, the organic light emitting diode display device according to the fourth exemplary embodiment includes a plurality of pixels P41, P42, and P43, and each of these pixels includes a plurality of sub-pixels.

For example, a first pixel P41 of the organic light emitting diode display device according to the fourth exemplary embodiment includes a first sub-pixel SP119, a second sub-pixel SP210, a third sub-pixel SP310, and a fourth sub-pixel SP410, a second pixel P42 includes a first sub-pixel SP120, a second sub-pixel SP211, a third sub-pixel SP311, and a fourth sub-pixel SP411; and a third pixel P43 includes a first sub-pixel SP121, a second sub-pixel SP212, a third sub-pixel SP312, and a fourth sub-pixel SP412.

Herein, a fourth color filter layer 540, a fifth color filter layer 550, and a sixth color filter layer 560 may be disposed corresponding to the first sub-pixels SP119, SP120, and SP121, respectively. Herein, at least two of the fourth to sixth color filter layers 540, 550, and 560 may include two or more color layers, and the two or more color layers may be disposed to be in contact with one side of different color layers. Further, the two or more color layers may respectively have different colors, and one color filter layer may include one color layer, but is not limited thereto.

The brightness of the organic light emitting diode display device may increase and power consumption may decrease as compared with a device that includes one color layer, because two or more color layers have different colors. For example, a broader range of wavelengths can be absorbed by two or more color layers, and, thus, an external light absorption ratio of a color filter layer including two or more color layers may be increased. Therefore, even if the color filter layer is thin, the color filter layer can absorb a broader range of wavelengths of the external light. Further, the brightness of the organic light emitting diode display device can be increased and power consumption can be decreased accordingly because the thicknesses of at least two of the fourth to sixth color filter layers 540, 550, and 560 are decreased.

For example, as illustrated in FIG. 8 and FIG. 9, the fourth color filter 540 may be disposed in the first sub-pixel SP119 of the first pixel P41, and may include a first color layer 540a and a second color layer 540b disposed on one side of the first color layer 540a. The first color layer 540a and the second color layer 540b may respectively have different colors. For example, the first color layer 540a may be a red (R) color layer and the second color layer 540b may be a green (G) color layer.

Further, the sixth color filter layer 560 disposed in the first sub-pixel S121 of the third pixel P43 may also be formed of two color layers. The sixth color filter layer 560 may include a third color layer 560a and a fourth color layer 560b disposed to be in contact with one side of the third color layer 560a. For example, the third color layer 560a may be a red (R) color layer and the fourth color layer 560b may be a green (G) color layer.

Furthermore, the fifth color filter layer 550 may be disposed in the first sub-pixel SP120 of the second pixel P42, and the fifth color filter layer 550 may be formed of one color layer. For example, the fifth color filter layer 550 may be formed of a blue (B) color layer.

Herein, a sum of the areas of the red (R), green (G), and blue (B) color layers disposed in the first sub-pixels SP119, SP120, and SP120, respectively, may be the same. That is, a sum of the areas of the first color layer 540a and the third color layer 560a may be the same as a sum of areas of the second color layer 540b and the fourth color layer 560b and a sum of an area of the color layer of the fifth color filter layer 550. Thus, it is possible to express a clear black color.

Since the fourth to sixth color filter layers 540, 550, and 560 are formed as described above, when the organic light emitting diode display device is in a black state, the color of a color filter disposed in another sub-pixel cannot be seen and a clear black color can be realized. Further, it is possible to reduce the reflectance by absorbing the external light incident on the device.

In the organic light emitting diode display device according to the fourth exemplary embodiment, each color filter included in the fourth to sixth color filter layers 540, 550, and 560 are not limited to FIG. 8 and FIG. 9 and may be formed as illustrated in FIG. 10 and FIG. 11.

FIG. 10 and FIG. 11 are plan views illustrating the configuration of color layers disposed in a first sub-pixel of an organic light emitting diode display device. Referring to FIG. 10, a fourth color filter layer 640 disposed in a first sub-pixel SP122 may be formed of a first color layer 640*a* and a second color layer 640*b*, a fifth color filter layer 650 may be formed of one color layer, and a sixth color filter layer 660 may be formed of a third color layer 660*a* and a fourth color layer 660*b*.

Herein, the first color layer 640*a* and the third color layer 660*a* may be green (G) color layers, the second color layer 640*b* and the fourth color layer 660*b* may be blue (B) color layers, and the fifth color filter layer 650 may be a red (R) color layer.

Further, in FIG. 11, a fourth color filter layer 740 disposed in a first sub-pixel SP125 may be formed of a first color layer 740*a* and a second color layer 740*b*, a fifth color filter layer 750 may be formed of one color layer, and a sixth color filter layer 760 may be formed of a third color layer 760*a* and a fourth color layer 760*b*.

Herein, the first color layer 740*a* and the third color layer 760*a* may be blue (B) color layers, the second color layer 740*b* and the fourth color layer 760*b* may be red (R) color layers, and the fifth color filter layer 750 may be a green (G) color layer.

That is, as described above, in the organic light emitting diode display device according to the fourth example embodiment, the red (R), green (G), and blue (B) color layers disposed in the first sub-pixels have the same sum of areas regardless of an alignment sequence of the color layers.

The table below compares the reflectance, power consumption, black color expression and efficiency of organic light emitting diodes according to a working Example of the present disclosure and a Comparative Example.

|  | Reflectance (%) | White Efficiency (Cd/A) | Power Consumption (W) | Black Color Expression | |
|---|---|---|---|---|---|
|  |  |  |  | b* | b* |
| Example | 19.1 | 112 | 10.5 | 1.83 | 10.6 |
| Comparative Example | 10.5 | 73 (R, G, B average) | 12.8 | −1.27 | 0.66 |

A display device of the Comparative Example is an organic light emitting diode display device which does not include a polarizing plate and in which a color filter layer is not disposed in a white (W) sub-pixel. In comparison, a display device of the working Example is an organic light emitting diode display device which does not include a polarizing plate and in which a color filter layer having a smaller height than color filter layers disposed in red (R), green (G), and blue (B) sub-pixels is disposed in a white (W) sub-pixel and red (R), green (G), and blue (B) color filter layers are alternately disposed in the white (W) sub-pixel.

As seen from the Table above, the organic light emitting diode display device of the Comparative Example has a high white efficiency, i.e., brightness and low power consumption but has a very high reflectance and poor black color expression as compared with the organic light emitting diode display device of the working Example.

Thus, the organic light emitting diode display device of the working Example has very low reflectance and clear black color expression compared with the organic light emitting diode display device of the Comparative Example.

That is, as shown in the Table above, although the organic light emitting diode display device according to the exemplary embodiments of the present disclosure does not include a polarizing plate, it is possible to significantly reduce the reflectance and realize a high quality black color output. The features, structures, effects, etc. described in the above exemplary embodiments are included in at least one exemplary embodiment and but are not limited to any one exemplary embodiment. In addition, the features, structures, effects, etc. described in the respective exemplary embodiments may be executed by those skilled in the art while being combined or modified with respect to other embodiments. Accordingly, it will be understood that contents related the combination and modification will be included in the scope of the present disclosure.

Further, it should be understood that the exemplary embodiments described above should be considered in a descriptive sense only and not for purposes of limitation. It will be understood by those skilled in the art that various other modifications and applications may be made therein without departing from the spirit and scope of the exemplary embodiments. For example, respective components shown in detail in the exemplary embodiments may be executed while being modified.

What is claimed is:

1. An organic light emitting diode display device comprising a substrate including a plurality of pixels, wherein each pixel comprises:
   red, white, green, and blue sub-pixels; and
   at least four color filter layers,
   wherein at least three color filter layers are disposed on the red, green, and blue sub-pixels, respectively, and at least a fourth color filter layer is disposed on the white sub-pixel,
   wherein a color of the fourth color filter layer is the same as any one of the colors of the first three color filter layers, and a thickness of the fourth color filter layer is smaller than a thickness of each of the first three color filter layers,
   wherein the color of the fourth color filter layer alternates in a sequence of the colors of the first to third color filter layer,
   wherein a black matrix is disposed in the white sub-pixel such that the black matrix covers at least a portion of a side surface of an adjacent color filter layer, and
   wherein the plurality of pixels comprises at least two of the fourth color filter layers, and the at least two fourth color filter layers have different thicknesses.

2. The organic light emitting diode display device of claim 1, wherein the device further comprises an organic light emitting diode comprising a first electrode, an organic light emitting layer, and a second electrode,
   wherein the first electrode is a reflective electrode and the second electrode is a transparent conductive material.

3. The organic light emitting diode display device of claim 1, wherein the thickness of each of the first three color filter layers is 2 μm to 3 μm, and the thickness of the fourth color filter layer is 0.1 μm to 1 μm.

4. The organic light emitting diode display device of claim 1, wherein the at least three color filter layers are blue, green, and red color filter layers, which are arranged to alternate sequentially.

5. The organic light emitting diode display device of claim 4, wherein:
- the blue color filter layer is configured to transmit light with a wavelength of 450 to 470 nm and absorb other wavelengths of light;
- the green color filter layer is configured to transmit light with a wavelength of 520 to 560 nm and absorb other wavelengths of light; and
- the red color filter layer is configured to transmit light with a wavelength of 620 to 640 nm and absorb other wavelengths of light.

6. The organic light emitting diode display device of claim 1, wherein the at least three color filter layers are blue, green and red color filter layers, which are arranged to alternate in a repeating sequence.

7. A device comprising a substrate including a plurality of pixels, wherein each pixel comprises:
- red, white, green, and blue sub-pixels;
- at least four color filter layers,
- wherein at least three color filter layers are disposed on the red, green, and blue sub-pixels, respectively, and at least a fourth color filter layer is disposed on the white sub-pixel,
- wherein a color of the fourth color filter layer is the same as any one of the colors of the first three color filter layers, and a thickness of the fourth color filter layer is smaller than a thickness of each of the first three color filter layers; and
- a black matrix disposed in the white sub-pixel such that the black matrix covers at least a portion of a side surface of an adjacent color filter layer,
- wherein the color of the fourth color filter layer alternates in a sequence of the colors of the first and third color filter layer, and
- wherein the plurality of pixels comprises at least two of the fourth color filter layers, and the at least two fourth color filter layers have different thicknesses.

* * * * *